(12) United States Patent
Colinge et al.

(10) Patent No.: US 9,786,774 B2
(45) Date of Patent: Oct. 10, 2017

(54) METAL GATE OF GATE-ALL-AROUND TRANSISTOR

(71) Applicant: Taiwan Semiconductor Manufacturing Company, Ltd., Hsin-Chu (TW)

(72) Inventors: Jean-Pierre Colinge, Hsin-Chu (TW); Chi-Wen Liu, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 134 days.

(21) Appl. No.: 14/318,377

(22) Filed: Jun. 27, 2014

(65) Prior Publication Data
US 2015/0380539 A1    Dec. 31, 2015

(51) Int. Cl.
| | | |
|---|---|---|
| *H01L 29/423* | (2006.01) | |
| *H01L 29/775* | (2006.01) | |
| *H01L 29/66* | (2006.01) | |
| *H01L 29/40* | (2006.01) | |
| *B82Y 10/00* | (2011.01) | |
| *B82Y 40/00* | (2011.01) | |
| *H01L 29/06* | (2006.01) | |
| *H01L 29/41* | (2006.01) | |

(52) U.S. Cl.
CPC .......... *H01L 29/775* (2013.01); *B82Y 10/00* (2013.01); *B82Y 40/00* (2013.01); *H01L 29/0676* (2013.01); *H01L 29/401* (2013.01); *H01L 29/413* (2013.01); *H01L 29/42392* (2013.01); *H01L 29/66439* (2013.01); *H01L 29/66469* (2013.01)

(58) Field of Classification Search
CPC ......... H01L 29/42392; H01L 29/78696; H01L 29/0665; H01L 29/0669; H01L 29/165; H01L 29/78642
See application file for complete search history.

(56) References Cited

U.S. PATENT DOCUMENTS

| | | | |
|---|---|---|---|
| 6,373,111 B1 | 4/2002 | Zheng et al. | |
| 7,425,491 B2 * | 9/2008 | Forbes ................. | B82Y 10/00 257/E21.41 |
| 8,063,450 B2 * | 11/2011 | Wernersson .......... | B82Y 10/00 257/213 |
| 8,178,862 B2 * | 5/2012 | Colinge ................ | B82Y 10/00 257/402 |

(Continued)

OTHER PUBLICATIONS

Choi, K. et al., "Growth mechanism of TiN film on dielectric films and the effects on the work function," Thin Solid Films 486, Elsevier B.V., 2005, pp. 141-144.

(Continued)

*Primary Examiner* — Bac Au
(74) *Attorney, Agent, or Firm* — Slater Matsil, LLP

(57) ABSTRACT

The disclosure relates to a semiconductor device. An exemplary structure for a semiconductor device comprises a nanowire structure comprising a channel region between a source region and a drain region; and a metal gate surrounding a portion the channel region, wherein the metal gate comprising a first gate portion adjacent to the source region having a first thickness and a second gate portion adjacent to the drain region having a second thickness less than the first thickness.

20 Claims, 19 Drawing Sheets

(56) References Cited

U.S. PATENT DOCUMENTS

| | | | | |
|---|---|---|---|---|
| 8,890,119 | B2* | 11/2014 | Doyle | H01L 29/66666 257/24 |
| 9,224,809 | B2* | 12/2015 | Li | H01L 29/0673 |
| 2008/0149914 | A1* | 6/2008 | Samuelson | B82Y 10/00 257/9 |
| 2010/0072460 | A1* | 3/2010 | Bjoerk | B82Y 10/00 257/24 |
| 2011/0233512 | A1* | 9/2011 | Yang | B82Y 10/00 257/9 |
| 2013/0264544 | A1* | 10/2013 | Karg | B82Y 10/00 257/24 |

OTHER PUBLICATIONS

Jeon, I.S. et al., "A Novel Methodology on Tuning Work Function of Metal Gate Using Stacking Bi-Metal Layers," Technical Digest of IED, IEDM 04, 2004, pp. 303-306.

* cited by examiner

METAL GATE OF GATE-ALL-AROUND TRANSISTOR

BACKGROUND

The disclosure relates to integrated circuit fabrication, and more particularly to a semiconductor device with a metal gate.

As the semiconductor industry has progressed into nanometer technology nodes in pursuit of higher device density, higher performance, and lower costs, challenges from both fabrication and design issues have resulted in the development of three-dimensional designs, such as a gate-all-around (GAA) transistor. A typical GAA transistor enables enhanced control of the charge carriers along the lengthwise direction through a complete encirclement of the channel region of a semiconductor nanowire by a gate dielectric and a gate electrode. The GAA transistor has a reduced short channel effect, because the channel region may be surrounded by the gate electrode so that an effect of the source/drain region on an electric field of the channel region may be reduced.

However, there are challenges to implementation of such features and processes in complementary metal-oxide-semiconductor (CMOS) fabrication. For example, it is difficult to effectively turn off the GAA transistor due to high on-current, thereby degrading the device performance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
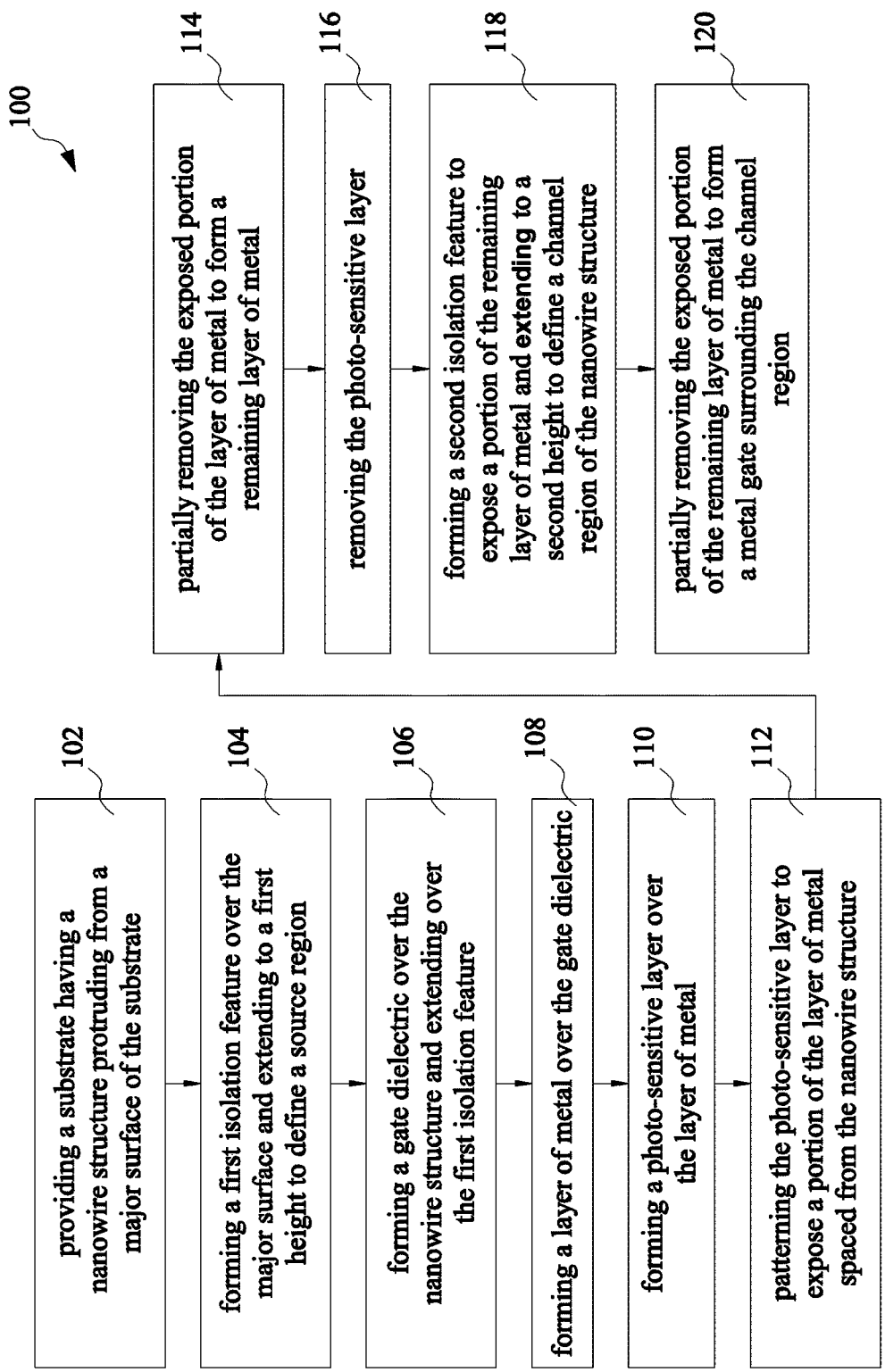
FIG. 1 is a flowchart illustrating a method of fabricating a metal gate of a semiconductor device according to various aspects of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, illustrated is a flowchart of a method 100 of fabricating a metal gate of a semiconductor device according to various aspects of the present disclosure. The method 100 begins with step 102 in which a substrate having a nanowire structure protruding from a major surface of the substrate is provided. The method 100 continues with step 104 in which a first isolation feature is formed over the major surface and extending to a first height to define a source region. The method 100 continues with step 106 in which a gate dielectric is formed over the nanowire structure and extending over the first isolation feature. The method 100 continues with step 108 in which a layer of metal is formed over the gate dielectric.

The method 100 continues with step 110 in which a photo-sensitive layer is formed over the layer of metal. The method 100 continues with step 112 in which the photo-sensitive layer is patterned to expose a portion of the layer of metal spaced from the nanowire structure. The method 100 continues with step 114 in which the exposed portion of the layer of metal is partially removed to form a remaining layer of metal. The method 100 continues with step 116 in which the photo-sensitive layer is removed.

The method 100 continues with step 118 in which a second isolation feature is formed to expose a portion of the remaining layer of metal and extending to a second height to define a channel region of the nanowire structure. The method 100 continues with step 120 in which the exposed portion of the remaining layer of metal is partially removed to form a metal gate surrounding the channel region. The discussion that follows illustrates embodiments of semiconductor devices that can be fabricated according to the method 100 of FIG. 1.

Figure 2B:
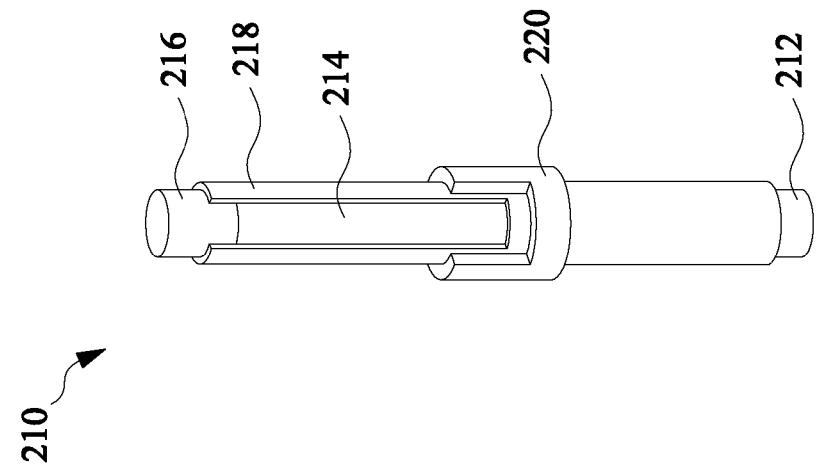
FIG. 2B is an enlarged perspective view of a semiconductor device comprising a metal gate according to various aspects of the present disclosure.
Figure 2A:
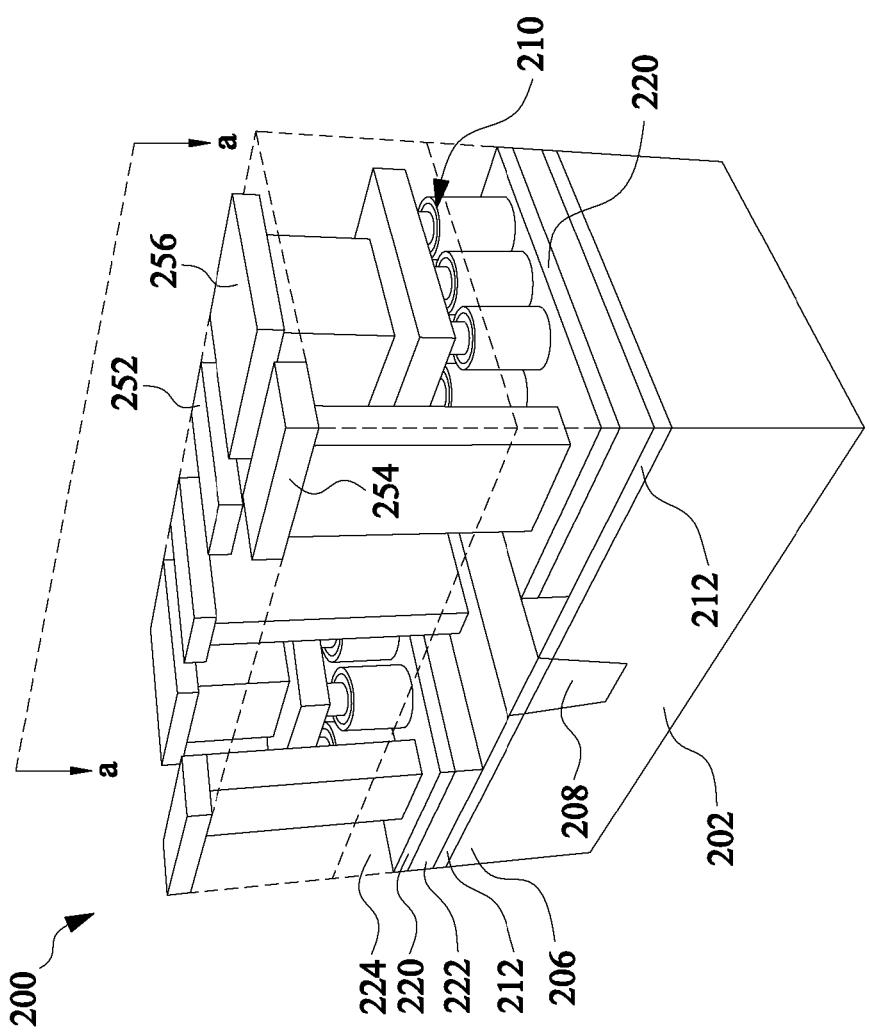
FIG. 2A is a perspective view of a semiconductor device comprising a metal gate according to various aspects of the present disclosure.

FIG. 2A is a perspective view of a semiconductor device 200 comprising a metal gate 220 according to various aspects of the present disclosure. FIG. 2B is an enlarged perspective view of a semiconductor device 200 comprising a metal gate 220 according to various aspects of the present disclosure. FIGS. 3-17 are cross-sectional views of a semiconductor device 200 taken along the line a-a of FIG. 2A at various stages of fabrication according to various embodiments of the present disclosure. As employed in the present disclosure, the term semiconductor device 200 refers to a gate-all-around (GAA) transistor and is hereinafter referred to as GAA transistor 200. The GAA transistor 200 refers to any nanowire-based, multi-gate transistor. Other transistor structures and analogous structures are within the contemplated scope of the disclosure. The GAA transistor 200 may be included in a microprocessor, memory cell, and/or other integrated circuit (IC).

It is noted that the method of FIG. 1 does not produce a completed GAA transistor 200. A completed GAA transistor 200 may be fabricated using complementary metal-oxide-semiconductor (CMOS) technology processing. Accordingly, it is understood that additional processes may be provided before, during, and after the method 100 of FIG. 1, and that some other processes may only be briefly described herein. Also, FIGS. 1 through 17 are simplified for a better understanding of the concepts of the present disclosure. For example, although the figures illustrate the GAA transistor 200, it is understood the IC may comprise a number of other devices comprising resistors, capacitors, inductors, fuses, etc.

Referring to FIGS. 2A and 2B, the GAA transistor 200 is fabricated on a substrate 202 using nanowire technology. In one embodiment, the substrate 202 comprises a semiconductor substrate (e.g., Si, SiGe, or SiGeB). In alternative embodiments, the substrate 202 comprises a silicon-on-insulator (SOI) structure. In some embodiments, the substrate 202 may comprise a compound semiconductor including silicon carbide, gallium arsenide, gallium phosphide, indium phosphide, indium arsenide, and indium antimonide; an alloy semiconductor including SiGe, SiGeSn, GeSn, GaAsP, AlInAs, AlGaAs, GaInAs, GaInP, and GaInAsP; any other suitable material; or combinations thereof.

In some embodiments, the substrate 202 may comprise various doped regions 206 depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions 206 may be configured for an n-type GAA transistor, or alternatively configured for a p-type GAA transistor. In some embodiments, the substrate 202 may include isolation regions 208 to isolate the various doped regions 206.

In some embodiments, the GAA transistor 200 further includes a source region 212 in the substrate 202, one or more nanowire structures 210, and a metal gate 220 surrounding a channel region 214 of the nanowire structures 210. The nanowire structures 210 in this example are oriented in a vertical direction and extend upwardly from the source region 212. In other examples, the nanowire structures 210 may extend in other directions such as a horizontal direction (not shown). Also, although nanowires with a circular cross-sectional shape are shown in this example, in other examples the cross-sectional shape may include circular, square, rectangular, triangular, trapezoidal, or other shapes. The example nanowire structure 210 comprises semiconductor material such as silicon that is used to form the channel region 214 between the source region 212 and a drain region 216. The drain region 216 in this example is at the far end section of the nanowire structure 210 opposite the source region 212 and may comprise a metal silicide (not shown). Gate dielectric 218 is also shown surrounding the nanowire structure 210.

In some embodiments, the GAA transistor 200 further includes a first isolation feature 222 above the substrate 202 and surrounding an upper portion of the source region 212. In some embodiments, the GAA transistor 200 further includes a second isolation feature 224 above the first isolation feature 222 and surrounding an upper portion of the gate electrode 220. Metal contacts are also included in the GAA transistor 200. In this example, shown are a source contact 252, a gate contact 254 and a drain contact 256.

The number of nanowires needed in a design may be a function of the drive current required for the semiconductor device 200. By increasing the drive current per nanowire, the number of nanowires required to produce the desired drive current may be reduced. For simplicity and clarification, each nanowire structure 210 of each GAA transistor 200 comprises one nanowire (shown in FIGS. 3-17), although it may comprise more nanowires (shown in FIG. 2A).

Referring to FIGS. 3-7 and step 102 in FIG. 1, a substrate 202 having a nanowire structure 210 protruding from a major surface 202s of the substrate 202 is provided. In one embodiment, a pad layer 204a and a mask layer 204b are formed on a top surface 202t of the substrate 202. The pad layer 204a may be a thin film comprising silicon oxide formed, for example, using a thermal oxidation process. The pad layer 204a may act as an adhesion layer between the semiconductor substrate 202 and mask layer 204b. The pad layer 204a may also act as an etch stop layer for etching the mask layer 204b. In an embodiment, the mask layer 204b is formed of silicon nitride, for example, using low-pressure chemical vapor deposition (LPCVD) or plasma enhanced chemical vapor deposition (PECVD). The mask layer 204b is used as a hard mask during subsequent lithography processes.

Figure 3:
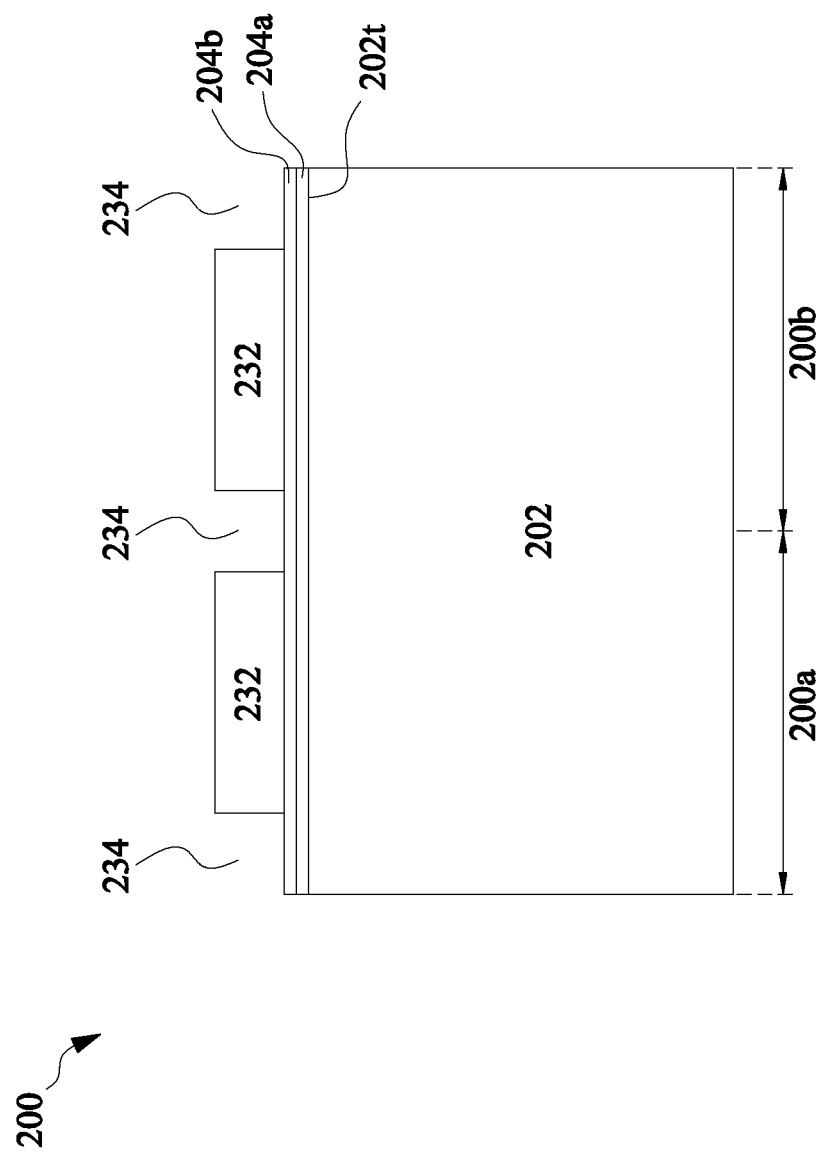
FIGS. 3-17 are cross-sectional views of a semiconductor device taken along the line a-a of FIG. 2A at various stages of fabrication according to various embodiments of the present disclosure.

A photo-sensitive layer 232 is formed on the mask layer 204b and is then patterned, forming openings 234 in the photo-sensitive layer 232 (shown in FIG. 3). In some embodiment, the lithography processes include forming a photo-sensitive layer 232 by spin-on coating; exposing the photo-sensitive layer 232 using an exposure energy, such as ultraviolet (UV) light, and developing the exposed photo-sensitive layer 232 to form the patterned photo-sensitive layer 232 (i.e., openings 234) using a developing chemical. In another example, the lithography process includes spin-on coating, soft baking, exposing, post-exposure baking, developing and hard baking. In other embodiment, the lithography process to form the patterned photoresist layer 232 may alternatively use other technique, such as e-beam lithography, maskless patterning or molecular print.

Figure 4:
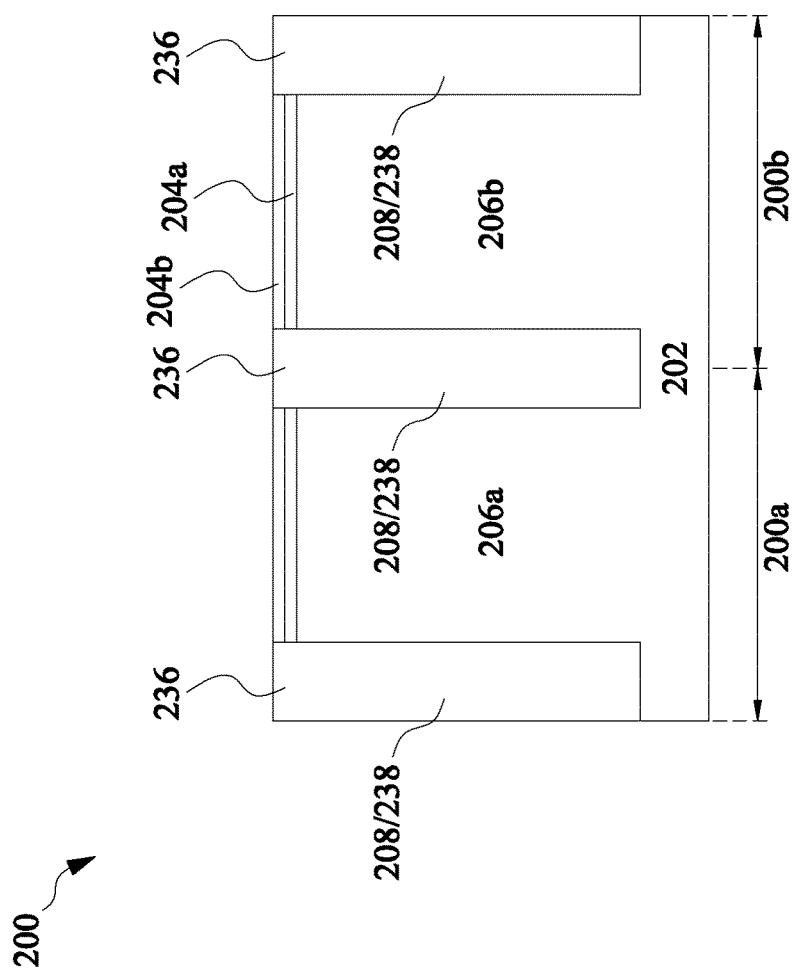

Subsequently, the structure in FIG. 4 is produced by forming the isolation regions 208 to isolate the various doped regions 206. In some embodiments, the various doped regions 206 comprise a first doped region 206a for a first GAA transistor 200a and a second doped region 206b for a first GAA transistor 200b. The mask layer 204b and pad layer 204a are etched through openings 234 to expose underlying semiconductor substrate 202. The exposed semiconductor substrate 202 is then etched to form trenches 236 in the semiconductor substrate 202. The photo-sensitive layer 232 is then removed. Next, a cleaning may be performed to remove a native oxide of the semiconductor substrate 202. The cleaning may be performed using diluted hydrofluoric (DHF) acid.

Trenches 236 are then filled with a dielectric material 238, followed by a chemical mechanical polish (CMP) to form the isolation regions 208. The dielectric material 238 may include silicon oxide, and hence is also referred to as oxide 238 in the present disclosure. In some embodiments, other dielectric materials, such as silicon nitride, silicon oxynitride, fluoride-doped silicate glass (FSG), or a low-K dielectric material, may also be used. In an embodiment, the oxide 238 may be formed using a high-density-plasma (HDP) CVD process, using silane ($SiH_4$) and oxygen ($O_2$) as reacting precursors. In other embodiment, the oxide 238 may be formed using a sub-atmospheric CVD (SACVD) process or high aspect-ratio process (HARP), wherein process gases may comprise tetraethylorthosilicate (TEOS) and ozone ($O_3$). In yet other embodiment, the oxide 238 may be formed using a spin-on-dielectric (SOD) process, such as hydrogen silsesquioxane (HSQ) or methyl silsesquioxane (MSQ).

Figure 5:
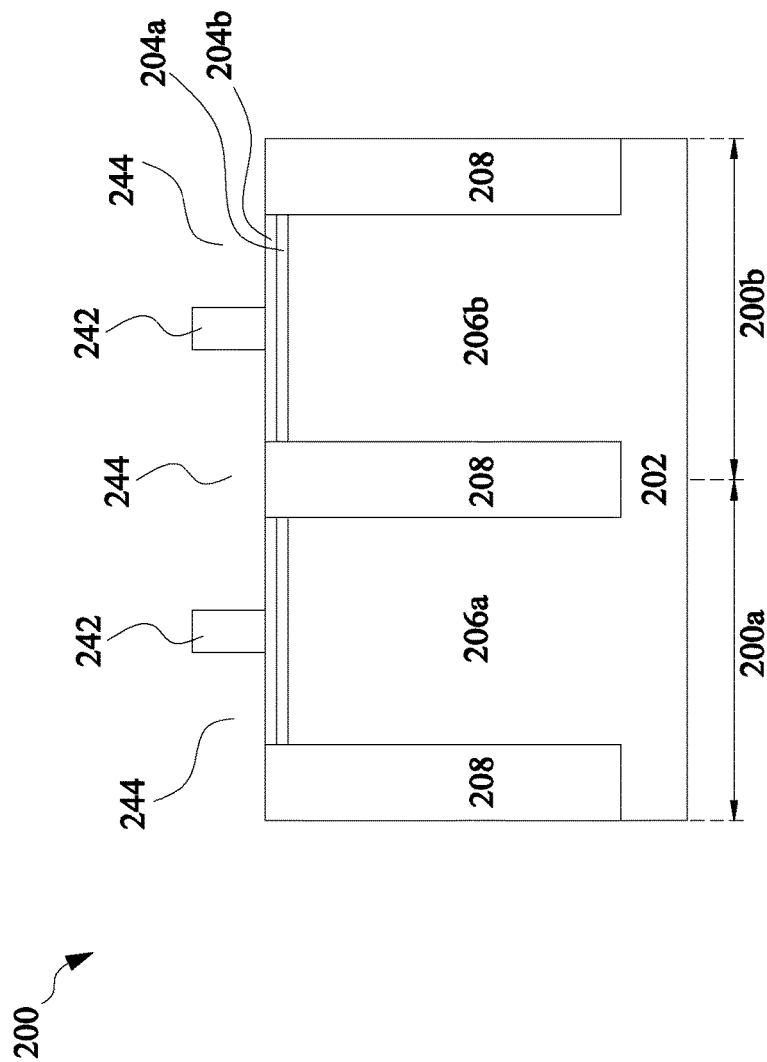

Referring to FIG. 5, after formation of the isolation regions 208, a photo-sensitive layer 242 is formed on the mask layer 204b and is then patterned, forming openings 244 in the photo-sensitive layer 242 to define areas for semiconductor nanowire structures on the semiconductor substrate 202.

Figure 6:
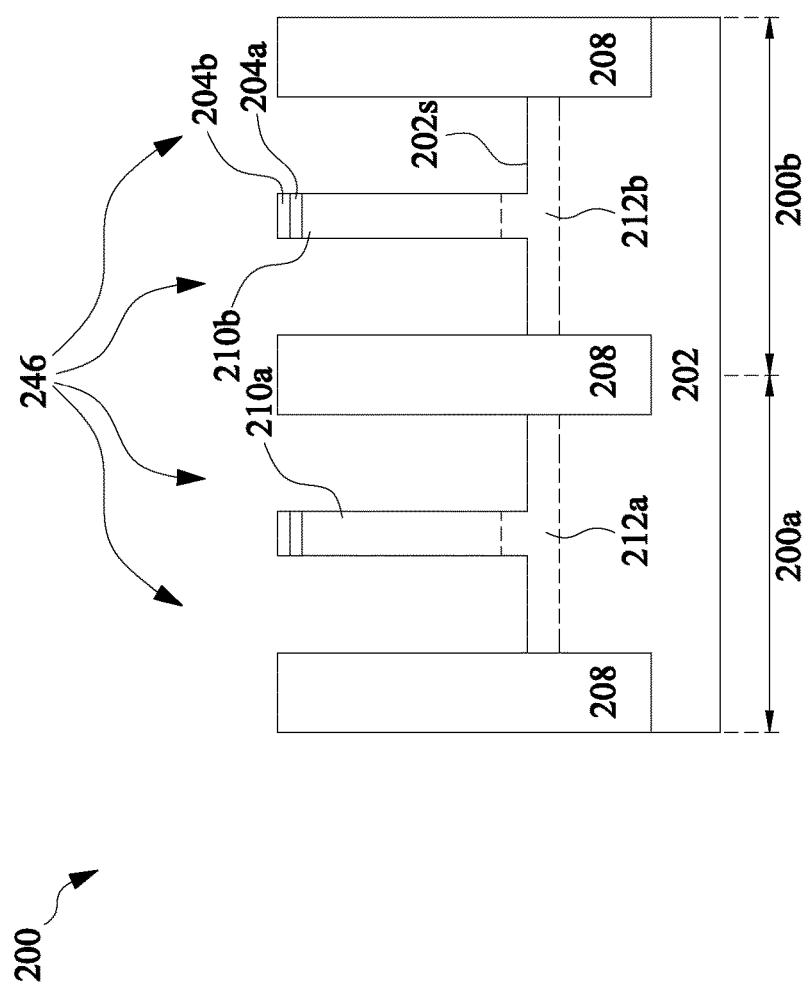

FIG. 6 depicts the resulting structure after forming a nanowire structure 210 (comprising a first nanowire structure 210a and a second nanowire structure 210b) protruding from a major surface 202s of the substrate 202. The mask layer 204b and pad layer 204a are etched through openings 244 to expose underlying semiconductor substrate 202. The exposed semiconductor substrate 202 is then etched to form the nanowire structure 210 in the semiconductor substrate 202. The photo-sensitive layer 242 is then removed. Next, a cleaning may be performed to remove a native oxide of the semiconductor substrate 202. The cleaning may be performed using diluted hydrofluoric (DHF) acid.

In some embodiments, the source region 212 is formed by a first ion implantation process 246 in the bottom portion of the nanowire structure 210 and further extended to the semiconductor substrate 202 below the major surface 202s. Thus, a first source region 212a is in the bottom portion of the first nanowire structure 210a and further extended to the adjacent semiconductor substrate 202 below the major surface 202s, while a second source region 212b is in the bottom portion of the second nanowire structure 210b and further extended to the adjacent semiconductor substrate 202 below the major surface 202s. In some embodiments, a metal silicide may be formed on the source region 212 (not shown).

The source region 212 includes an n-type dopant (such as phosphorous) when the GAA transistor 200 is n-type or a p-type dopant (such as boron) when the GAA transistor 200 is p-type. In some embodiments, the source region 212 formed by the ion implantation 246 is further annealed for activation by an annealing process. The annealing process is implemented right after the ion implantation 246 or is alternatively implemented after the formation of other doped features for collective activation. In one embodiment, the annealing process includes rapid thermal annealing (RTA). In other embodiments, the annealing process alternatively includes laser annealing, spike annealing, millisecond anneal (MSA) or other suitable annealing technique.

Figure 7:
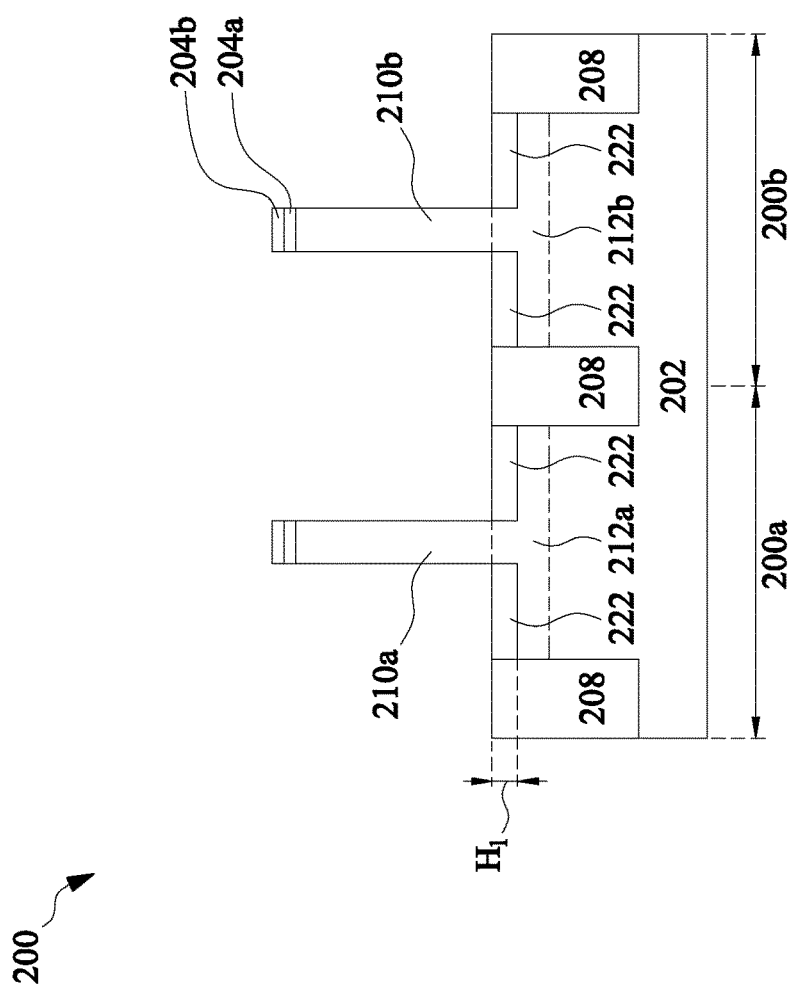

As depicted in FIG. 7 and step 104 in FIG. 1, for fabricating a first isolation feature 222 to isolate the substrate 202 and the gate electrode 220, the structure in FIG. 7 is produced by forming a first isolation feature 222 over the major surface 202s and extending to a first height $H_1$ to define the source region 212. In the depicted embodiment, the first isolation feature 222 provides isolation function to and properly configures various features of the GAA transistor 200. For examples, the gate electrode 220 is properly aligned with the channel region 214, not directly formed on the semiconductor substrate 202, and is substantially offset from the source region 212.

In some embodiments, the first isolation feature 222 includes a dielectric material, such as silicon oxide in the present example. The first isolation feature 222 may alternatively include other suitable dielectric material, such as silicon nitride, silicon oxynitride, carbon-doped silicon oxide, carbon-doped silicon nitride, or carbon-doped silicon oxynitride. In some embodiment, the forming of the dielectric material layer includes depositing a dielectric material using chemical vapor deposition (CVD), physical vapor deposition (PVD), or spin-on process, performing a CMP process to remove a portion of the dielectric material above the nanowire structure 210, and etch back the dielectric material to the first height $H_1$ to define the source region 212. Note that isolation regions 208 are also polished or etched back as well to be co-planar.

Figure 8:
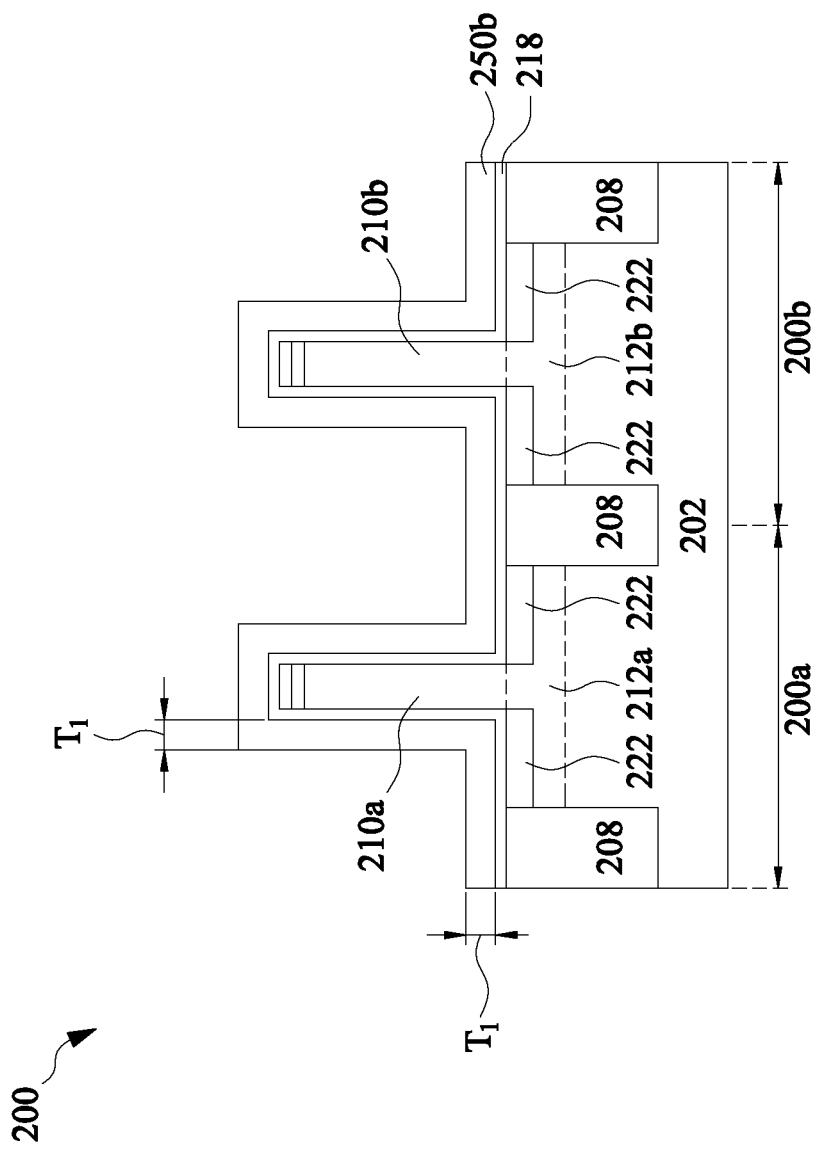

As depicted in FIG. 8 and step 106 in FIG. 1, for fabricating a metal gate surrounding the channel region 214 of the nanowire structure 210, the structure in FIG. 8 is produced by forming a gate dielectric 218 over the nanowire structure 210 and extending over the first isolation feature 222 and the isolation regions 208.

In some embodiments, the gate dielectric 218 may include silicon oxide, silicon nitride, silicon oxynitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the gate dielectric 218 is a high-k dielectric layer with a thickness in the range of about 5 to 30 angstroms. The gate dielectric 218 may be formed using a suitable process such as atomic layer deposition (ALD), chemical vapor deposition (CVD), physical vapor deposition (PVD), thermal oxidation, UV-ozone oxidation, or combinations thereof. The gate dielectric 218 may further comprise an interfacial layer (not shown) to reduce damage between the gate dielectric 218 and channel region 214 of the nanowire structure 210. The interfacial layer may comprise silicon oxide.

Then, the structure in FIG. 8 is produced by forming a layer of metal 250 over the gate dielectric 218 (step 108 in FIG. 1). In some embodiments, the layer of metal 250 may comprise a single layer or multilayer structure. In the present embodiment, the layer of metal 250 may include a metal such as Al, Cu, W, Ti, Ta, TiN, TiAl, TiAlN, TaN, NiSi, CoSi, other conductive materials with a work function compatible with the substrate material, or combinations thereof. In the present embodiment, the layer of metal 250 comprises a uniform thickness $T_1$, in the range of about 1 nm to about 20 nm. The layer of metal 250 may be formed using a suitable process such as ALD, CVD, PVD, plating, or combinations thereof.

The process steps up to this point have provided the substrate 202 having the layer of metal 250 over the nanowire structures 210. Conventionally, the layer of metal 250 may be selectively etched to form a metal gate with uniform thickness to define channel region of the nanowire structures 210. The gate electrode with uniform thickness induces sufficient amount of electric field into channel region of a GAA transistor. However, it is difficult to effectively turn-off the GAA transistor due to high on-current, thereby degrading the device performance. As such, there is a need to decrease the off-current of the GAA transistor.

Figure 18:
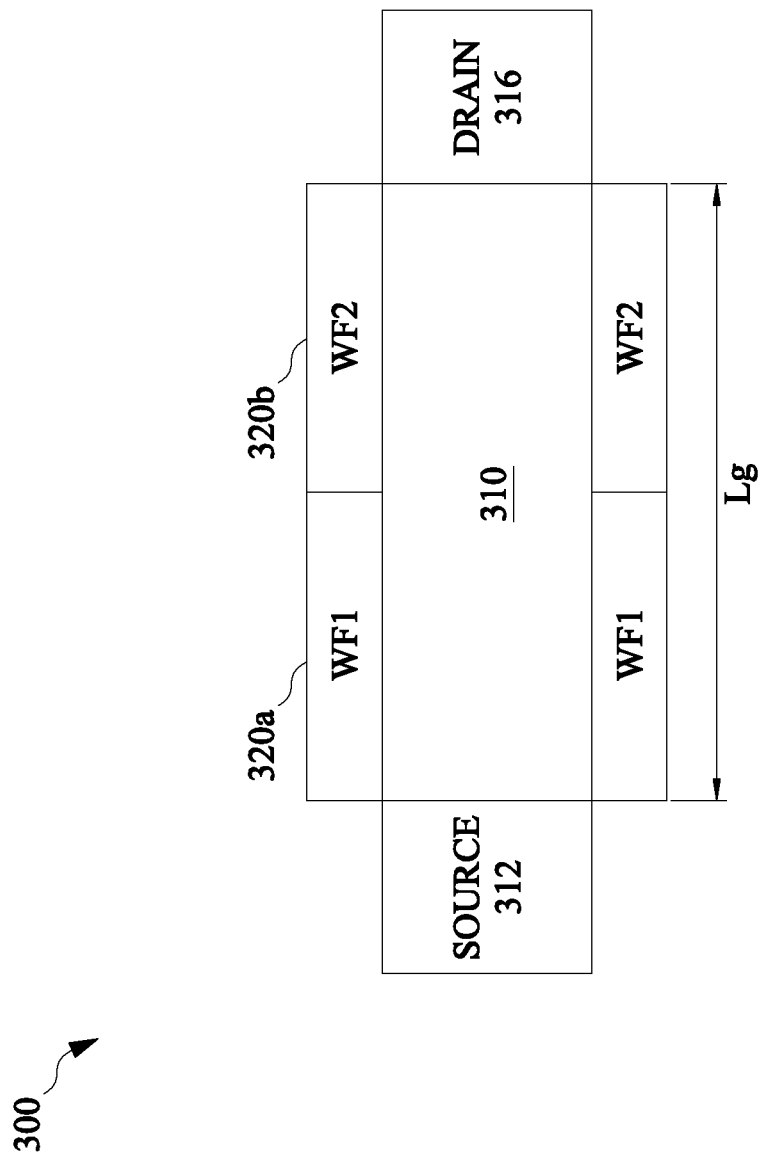
FIG. 18 is a diagram of an example semiconductor device having a channel formed from a nanowire structure according to various embodiments of the present disclosure.

FIG. 18 is a diagram of an example semiconductor device 300 having a channel formed from a nanowire structure according to various embodiments of the present disclosure. In some embodiments, the semiconductor device 300 comprises a source region 312, a drain region 316, and gate region 320 surrounding a nanowire structure 310. The gate region 320 has a total length $L_g$ and includes a first gate portion 320a and a second gate portion 320b. The first gate portion 320a is configured with a first work function WF1, and the second gate portion 320b is configured with a second work function WF2.

Figure 19:
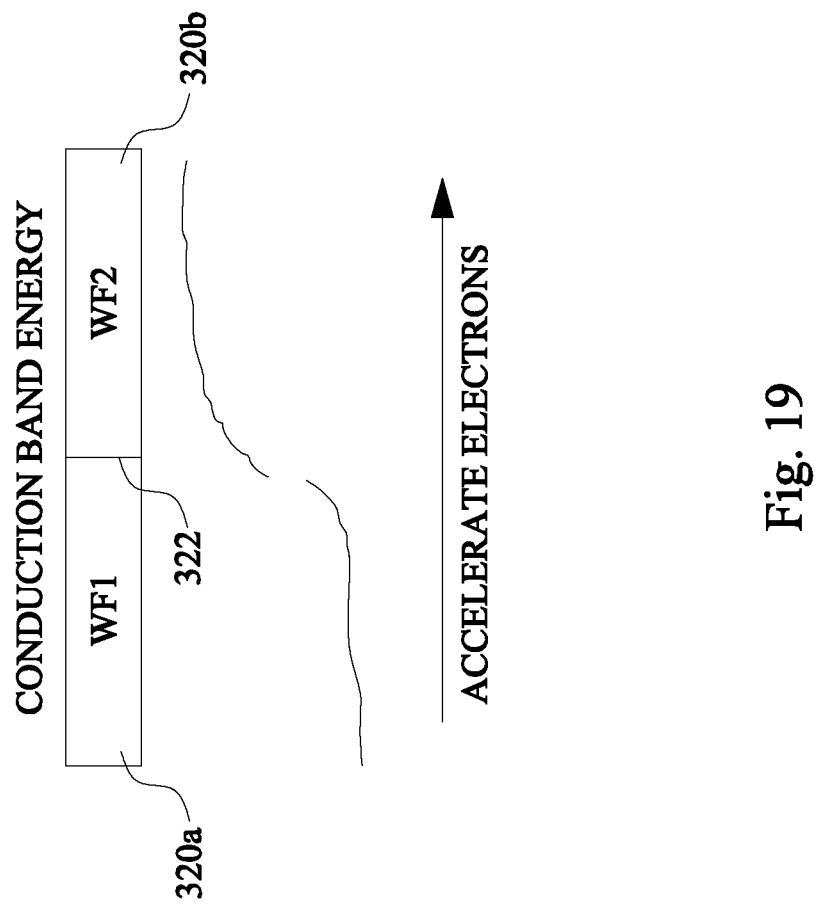
FIG. 19 is a diagram illustrating the effect of the different gate work functions on the conduction band energy $E_c$ the nanowire channel of FIG. 18 for an electron that traverses the channel.

FIG. 19 is a diagram illustrating the effect of the different gate work functions on the conduction band energy $E_c$ of the nanowire channel of FIG. 18 for an electron that traverses the channel. The first gate portion 320a and the second gate portion 320b are each formed at different thicknesses to generate different work functions for the two gate portions, wherein the second gate portion 320b with less thickness has a lower work function than the first gate portion 320a with greater thickness. As an electron traverses the channel, the conduction band energy increases. At the interface 322 between the two gate portions, the conduction band energy stabilizes due to the decreased work function in the second gate portion 320b. As an electron continues past the interface 322 the conduction band energy begins to spread again. The work function differences in the two gate portions can cause the flow of electrons from the first gate portion 320a to the second gate portions 320b to decelerate. The carrier velocity will be decreased by the work function induced electric field at the two gate portions interface 322, thereby more effectively turning off the GAA transistor.

Accordingly, the processing discussed below with reference to FIGS. 9-17 may form a metal gate with multiple thicknesses to replace the metal gate with uniform thickness. The metal gate with multiple thicknesses may decrease the off-current through the modulation of the channel electric field, thereby enhancing the device performance.

Figure 9:
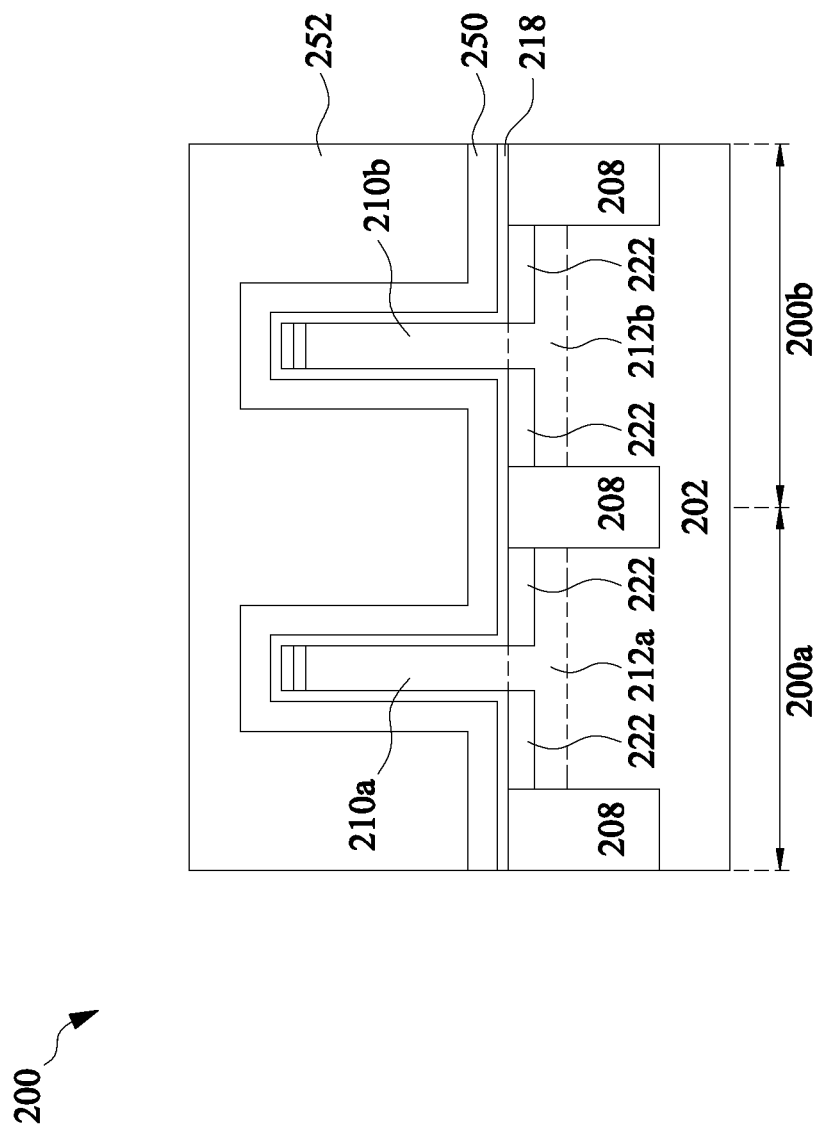

FIG. 9 shows the semiconductor device 200 of FIG. 8 after forming a photo-sensitive layer 252 over the layer of metal 250 (step 110 in FIG. 1).

Figure 10:
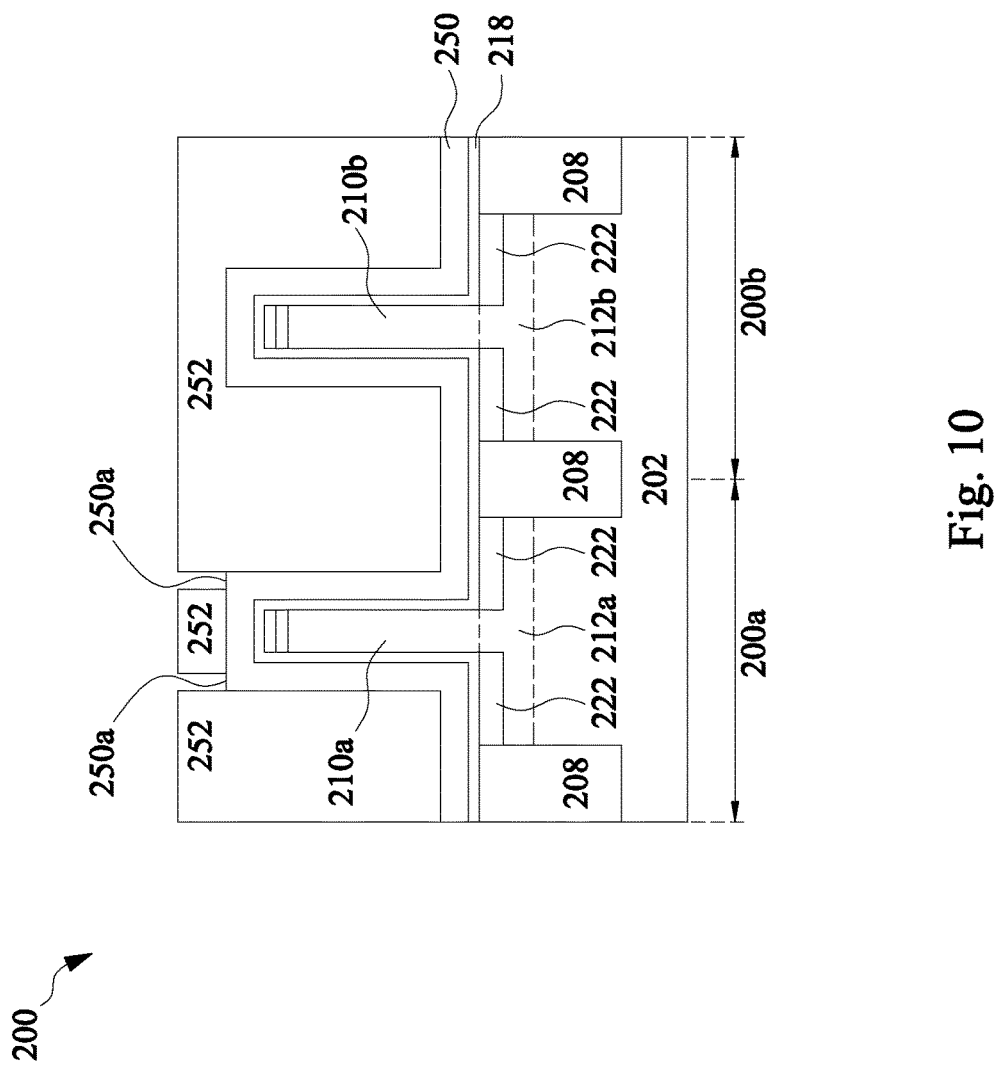

Referring to FIG. 10 and step 112 in FIG. 1, following the formation of the photo-sensitive layer 252, the structure in FIG. 10 is produced by patterning the photo-sensitive layer 252 to expose a portion 250a of the layer of metal 250 spaced from the nanowire structure 210a over the first source region 212a, while covering the layer of metal 250 over the second source region 212b.

Figure 11:
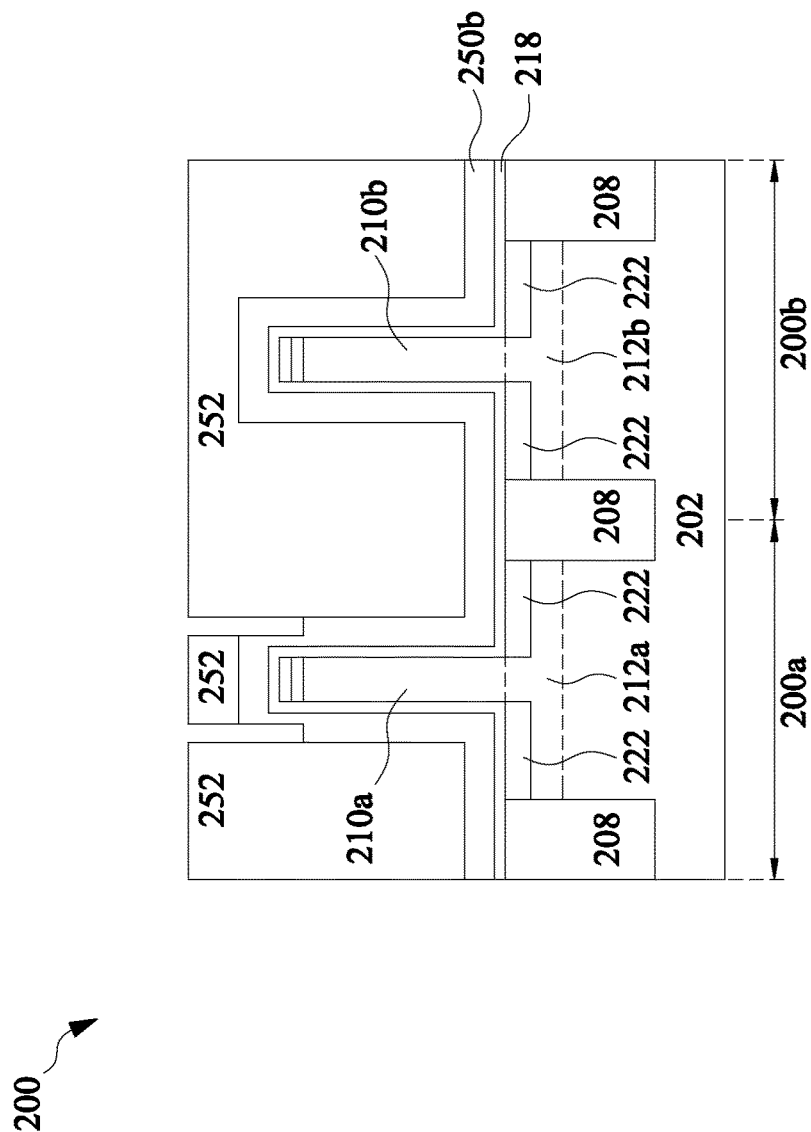

Referring to FIG. 11 and step 114 in FIG. 1, after patterning the photo-sensitive layer 252 to expose a portion 250a of the layer of metal 250, the structure in FIG. 11 is produced by partially removing the exposed portion 250a of the layer of metal 250 to form a remaining layer of metal 250b using the patterned photo-sensitive layer 252 as an etch mask. In some embodiments, partially removing the exposed portion 250a of the layer of metal 250 is performed using a dry etch process. In some embodiments, the dry etch process may be performed at a temperature of about 10° C. to about 50° C., under a bias power of about 100 W to about 1000 W and a pressure of about 1 mTorr to about 40 mTorr, using $Cl_2$, HBr, $BCl_3$, $NF_3$, $N_2$, $CF_4$ and $CH_2F_2$ as etching gas.

Figure 12:
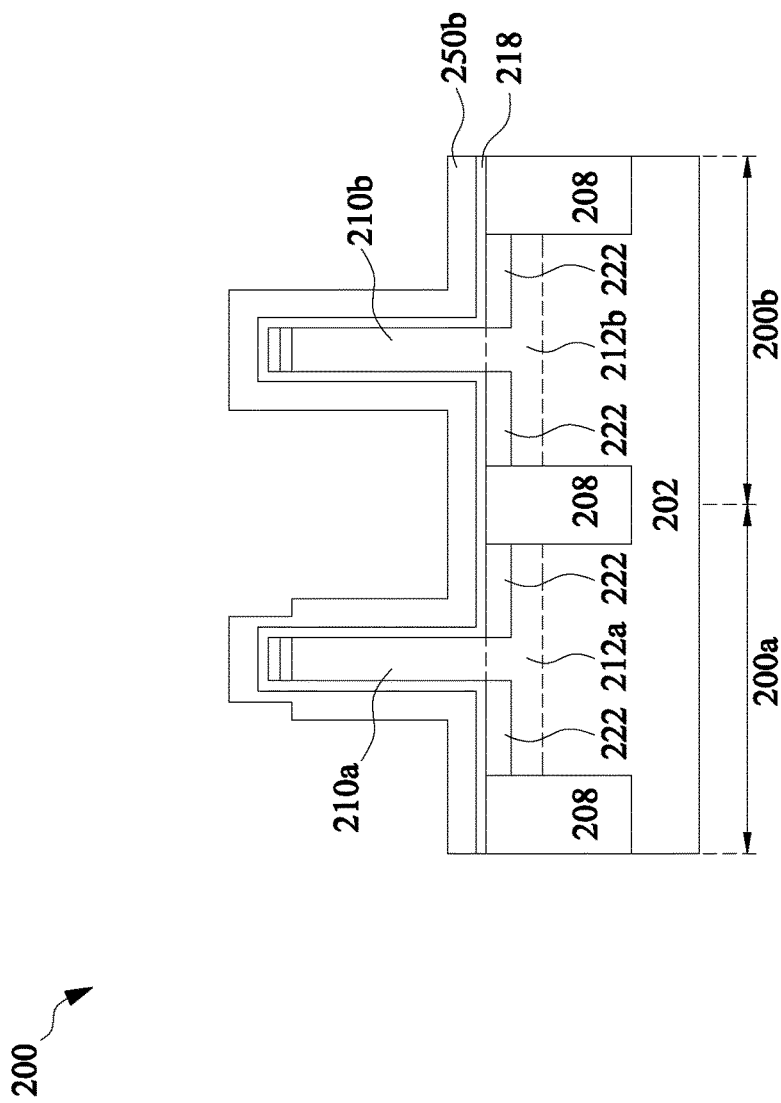

FIG. 12 shows the semiconductor device 200 of FIG. 11 after removing the photo-sensitive layer 252 (step 116 in FIG. 1).

Figure 13:
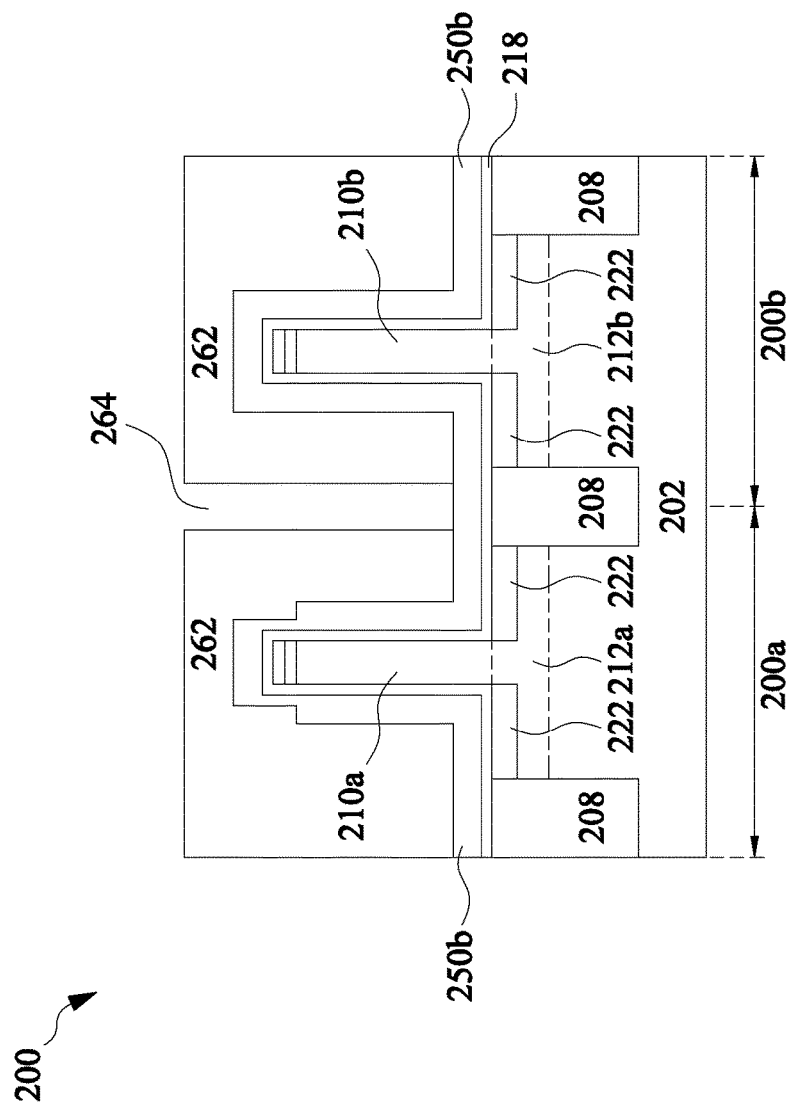

In order to form a first metal gate 220a of the first GAA transistor 200a and a second metal gate 220b of the second GAA transistor 200b (shown in FIG. 16), a photo-sensitive layer 262 is formed over the remaining layer of metal 250b by a suitable process, such as spin-on coating, and patterned by a lithography patterning method to form an opening 264 that exposes portions of the remaining layer of metal 250b to subsequent etch (shown in FIG. 13).

Figure 14:
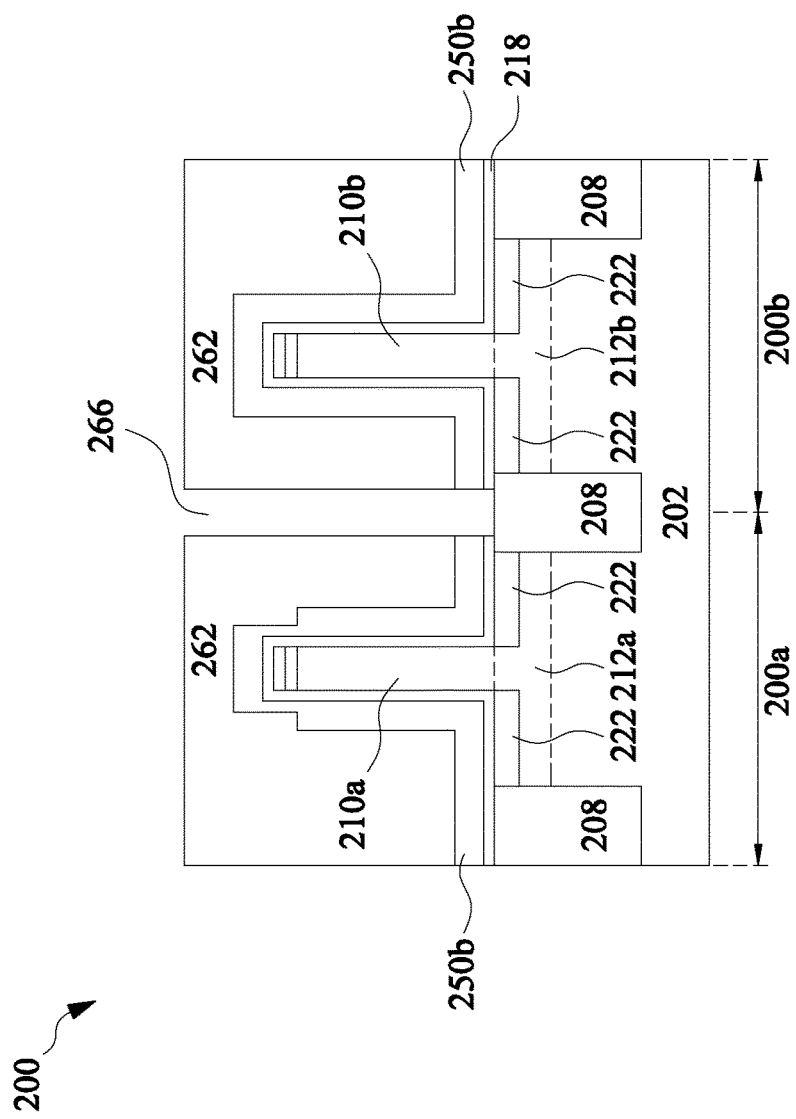

The opening 264 can then be transferred using a dry etching process to the underlying layers (i.e., a portion of the remaining layer of metal 250b and a portion of gate dielectric 218) to form an opening 266 over the isolation regions 208 (shown in FIG. 14). As such, the opening 266 isolates the first metal gate 220a and the second metal gate 220b (shown in FIG. 16). In some embodiments, the dry etch process may be performed at a temperature of about 10° C. to about 50° C., under a bias power of about 100 W to about 1000 W and a pressure of about 1 mTorr to about 40 mTorr, using $Cl_2$, HBr, $BCl_3$, $NF_3$, $N_2$, $CF_4$ and $CH_2F_2$ as etching gas. The photoresist layer may be stripped thereafter.

Figure 15:
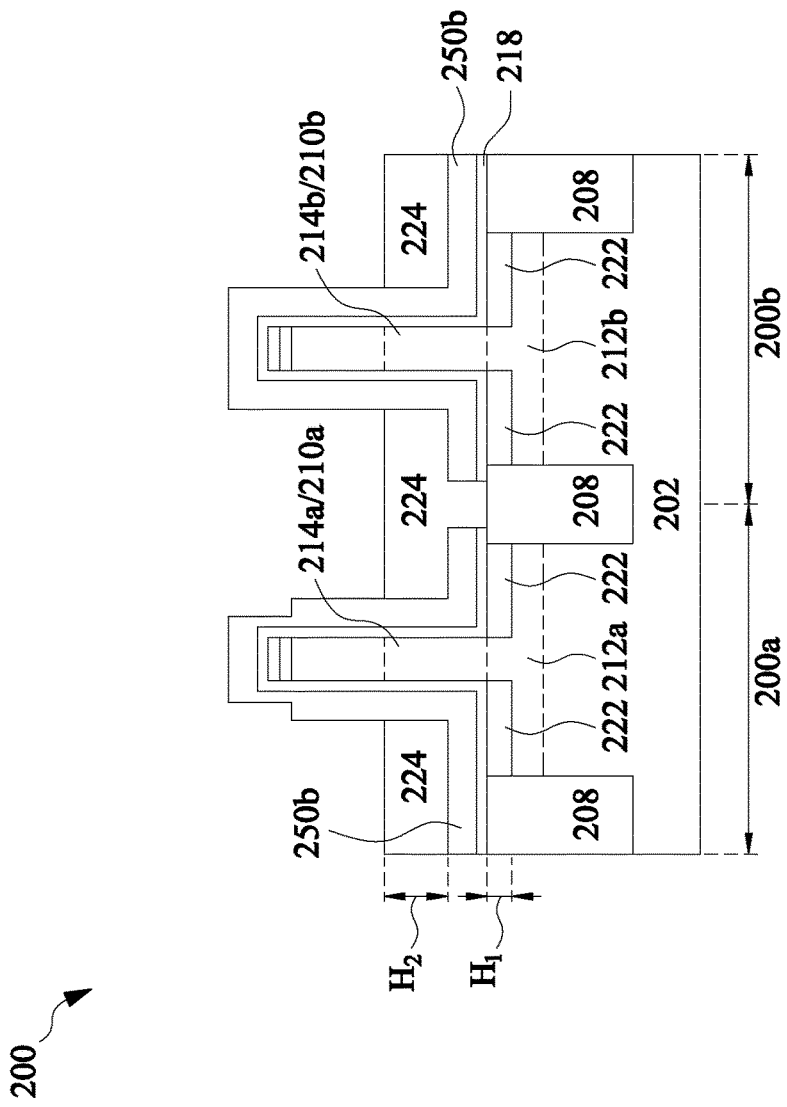

As depicted in FIG. 15 and step 118 in FIG. 1, for fabricating a second isolation feature 224 to isolate the first metal gate 220a and the second metal gate 220b, the structure in FIG. 15 is produced by forming a second isolation feature 224 to expose a portion of the remaining layer of metal 250b and extending to a second height $H_2$ to define a channel region 214 (comprising 214a and 214b) of the nanowire structure 210. In the depicted embodiment, the second isolation feature 224 properly configures various features of the GAA transistor 200. For examples, the metal gate 220 is properly aligned with the channel region 214, not directly formed on the semiconductor substrate 202, and is substantially off from the source region 212.

In some embodiments, the second isolation feature 224 includes a dielectric material, such as silicon oxide in the present example. The second isolation feature 224 may alternatively include other suitable dielectric material, such as silicon nitride, silicon oxynitride, carbon-doped silicon oxide, carbon-doped silicon nitride, or carbon-doped silicon oxynitride. In some embodiment, the forming of the dielectric material layer includes depositing a dielectric material using CVD, PVD, or spin-on process, performing a CMP process to remove a portion of the dielectric material above the nanowire structure 210 and further extending to the semiconductor substrate 202, and etch back the dielectric material to the second height $H_2$ to define the channel region 214.

Figure 16:
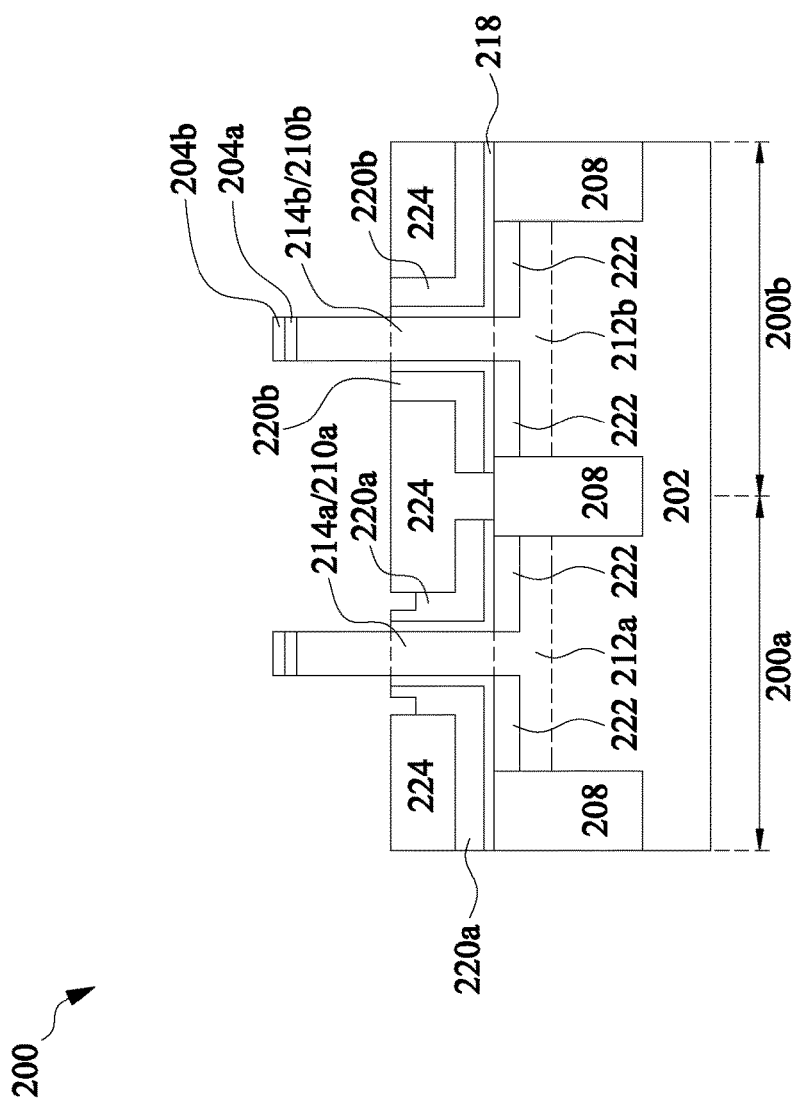

Referring to FIG. 16 and step 120 in FIG. 1, subsequent to the formation of the second isolation feature 224, the structure in FIG. 16 is produced by partially removing the exposed portion of the remaining layer of metal 250b to form a metal gate 220 (comprising 220a and 220b) surrounding the channel region 214. In some embodiments, partially removing the exposed portion of the remaining layer of metal 250b is performed using a dry etch process. In some embodiments, the dry etch process may be performed at a temperature of about 10° C. to about 50° C., under a bias power of about 100 W to about 1000 W and a pressure of about 1 mTorr to about 40 mTorr, using $Cl_2$, HBr, $BCl_3$, $NF_3$, $N_2$, $CF_4$ and $CH_2F_2$ as etching gas.

Figure 17:
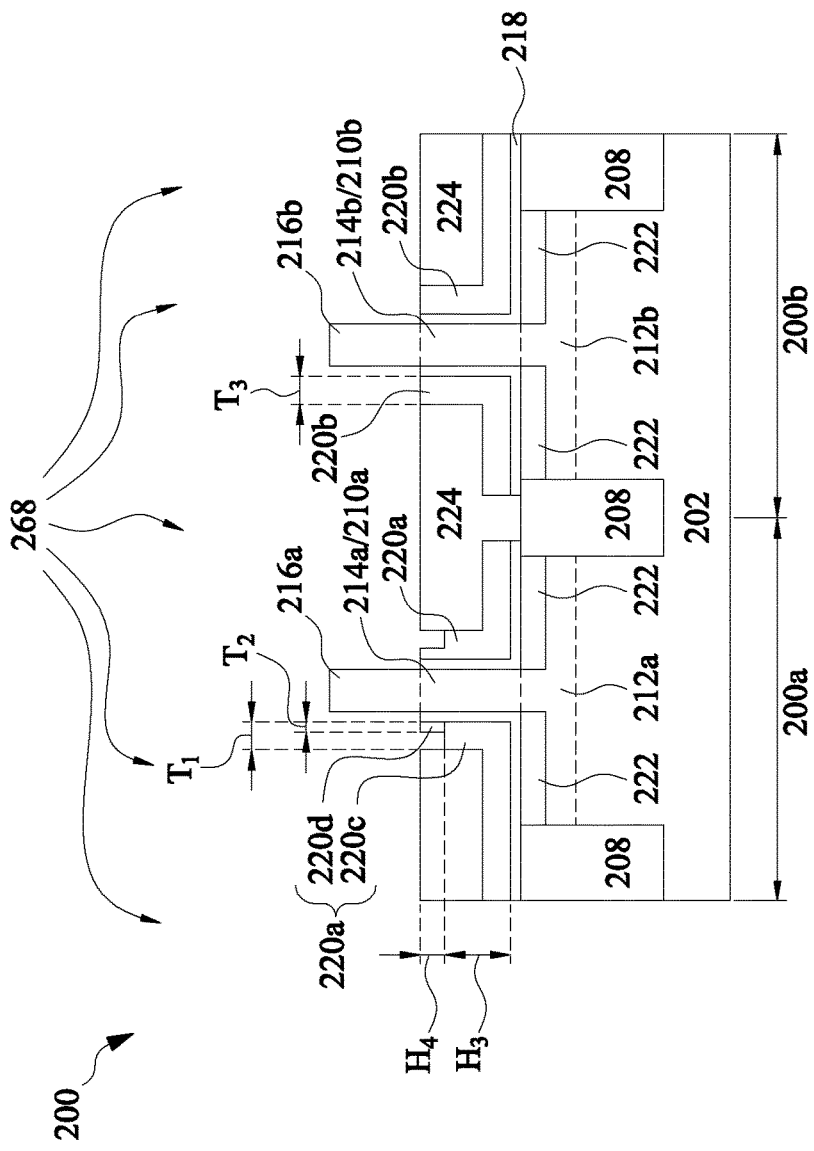

FIG. 17 shows the semiconductor device 200 of FIG. 16 after forming the drain region 216 of the nanowire structure 210. In some embodiments, after removing the mask layer 204b and pad layer 204a over the nanowire structure 210, the drain region 216 (comprising 216a and 216b) is formed by a second ion implantation process 268 in the upper portion of the nanowire structure 210. Thus, a first drain region 216a is in the upper portion of the first nanowire structure 210a, while a second drain region 216b is in the upper portion of the second nanowire structure 210b.

The drain region 216 includes an n-type dopant (such as phosphorous) when the GAA transistor 200 is n-type or a p-type dopant (such as boron) when the GAA transistor 200 is p-type. In some embodiments, the drain region 216 formed by the ion implantation 268 is further annealed for activation by an annealing process. The annealing process is implemented right after the ion implantation 268 or is alternatively implemented after the formation of other doped features for collective activation. In one embodiment, the annealing process includes rapid thermal annealing (RTA). In other embodiments, the annealing process alternatively includes laser annealing, spike annealing, million second anneal (MSA) or other suitable annealing technique.

In some embodiments, the first metal gate 220a comprises a first gate portion 220c adjacent to the first source region 212a having the first thickness $T_1$ and a second gate portion 220d adjacent to the first drain region 216a having a second thickness $T_2$ less than the first thickness $T_1$.

In the depicted embodiment, the second gate portion 220d (320b in FIG. 18) has a lower work function than the first gate portion 220c (320a in FIG. 18). The work function differences in the two gate portions can cause the flow of electrons from the first gate portion 220c to the second gate portions 220d to decelerate. The carrier velocity will be decreased by the work function induced electric field at the two gate portions interface, thereby more effectively turning off the GAA transistor.

In some embodiments, a ratio of the first thickness $T_1$ to the second thickness $T_2$ is from 1.5 to 10. In some embodiments, the cross-sectional shape of the second gate portion 220d comprises square, rectangular, or triangular. In some embodiments, the first gate portion 220c has a third height $H_3$ and the second gate portion 220d has a fourth height $H_4$ equal to or greater than the third height $H_3$. In some embodiments, a ratio of the third height $H_3$ to the fourth height $H_4$ is from 0.1 to 1. In some embodiments, the first gate portion 220c has a third height $H_3$ and the second gate portion 220d has a fourth height $H_4$ less than the third height $H_3$. In some embodiments, a ratio of the third height $H_3$ to the fourth height $H_4$ is from 1.5 to 10.

In some embodiments, the semiconductor device 200 comprises a first nanowire transistor 200a comprising a first nanowire structure 210a comprising a first channel region 214a between a first source region 212a and a first drain region 216a, and a first metal gate 220a surrounding a portion the first channel region 214a, wherein the first metal gate 220a comprises a first gate portion 220c adjacent to the first source region 212a having a first thickness $T_1$ and a second gate portion 220b adjacent to the first drain region 216a having a second thickness $T_2$ less than the first thickness $T_1$; and a second nanowire transistor 200b comprising a second nanowire structure 210b comprising a second channel region 214b between a second source region 212b and a second drain region 216b, and a second metal gate 220b surrounding a portion the second channel region 214b, wherein the second metal gate 220b has an uniform thickness $T_3$. In some embodiments, the first thickness $T_1$ is substantially equal to the uniform thickness $T_3$.

As such, using the gate electrode with multiple thicknesses to decrease the off-current through the modulation of the channel electric field, problems associated with high off current due to high on-current may be reduced and/or avoided. Thus, Applicant's method may achieve the desired device performance characteristics, such as low off current.

After the steps shown in FIG. 1, as further illustrated with respect to the example depicted in FIGS. 3-17, have been performed, subsequent processes, comprising interconnect processing, are typically performed to complete the semiconductor device 200 fabrication.

In accordance with one embodiment, a semiconductor device comprises a nanowire structure comprising a channel region between a source region and a drain region; and a metal gate surrounding a portion the channel region, wherein the metal gate comprising a first gate portion adjacent to the source region having a first thickness and a second gate portion adjacent to the drain region having a second thickness less than the first thickness.

In accordance with another embodiment, a semiconductor device comprises a first nanowire transistor comprising a first nanowire structure comprising a first channel region between a first source region and a first drain region, and a first metal gate surrounding a portion the first channel region, wherein the first metal gate comprises a first gate portion adjacent to the first source region having a first thickness and a second gate portion adjacent to the first drain region having a second thickness less than the first thickness; and a second nanowire transistor comprising a second nanowire structure comprising a second channel region between a second source region and a second drain region, and a second metal gate surrounding a portion the second channel region, wherein the second metal gate has an uniform thickness.

In accordance with another embodiments, a method of fabricating a semiconductor device comprises providing a substrate having a nanowire structure protruding from a major surface of the substrate; forming a first isolation feature over the major surface and extending to a first height to define a source region; forming a gate dielectric over the nanowire structure and extending over the first isolation feature; forming a layer of metal over the gate dielectric; forming a photo-sensitive layer over the layer of metal; patterning the photo-sensitive layer to expose a portion of the layer of metal spaced from the nanowire structure; partially removing the exposed portion of the layer of metal to form a remaining layer of metal; removing the photo-sensitive layer; forming a second isolation feature to expose a portion of the remaining layer of metal and extending to a second height to define a channel region of the nanowire structure; and partially removing the exposed portion of the remaining layer of metal to form a metal gate surrounding the channel region.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device comprising:
 a nanowire structure comprising a channel region between a source region and a drain region;
 a first isolation region over the source region;
 a second isolation region adjacent the source region and the first isolation region;
 a gate dielectric over the first isolation region and the second isolation region; and
 a metal gate surrounding a portion of the channel region, the metal gate comprising:
  a first gate portion contacting a top surface of the gate dielectric, the first gate portion having a vertical region and a horizontal region, the vertical region having a first thickness, the horizontal region disposed over the first isolation region and the second isolation region; and
  a second gate portion over the first gate portion, the second gate portion having a second thickness less than the first thickness.

2. The semiconductor device of claim 1, wherein a ratio of the first thickness to the second thickness is from 1.5 to 10.

3. The semiconductor device of claim 1, wherein the first gate portion has a first height and the second gate portion has a second height equal to or greater than the first height.

4. The semiconductor device of claim 3, wherein a ratio of the first height to the second height is from 0.1 to 1.

5. The semiconductor device of claim 1, wherein the first gate portion has a first height and the second gate portion has a second height less than the first height.

6. The semiconductor device of claim 5, wherein a ratio of the first height to the second height is from 1.5 to 10.

7. The semiconductor device of claim 1, wherein a cross-sectional shape of the second gate portion comprises a square, rectangular, or triangular shape.

8. The semiconductor device of claim 1, wherein the first gate portion and the second gate portion are a contiguous same material.

9. A semiconductor device comprising:
a first nanowire transistor comprising:
  a first nanowire structure comprising a first channel region between a first source region and a first drain region, and
  a first metal gate surrounding a portion of the first channel region, the first metal gate comprising:
    a first gate portion adjacent to the first source region having a first thickness, and
    a second gate portion adjacent to the first drain region having a second thickness less than the first thickness; and
a second nanowire transistor comprising:
  a second nanowire structure comprising a second channel region between a second source region and a second drain region, and
  a second metal gate surrounding a portion of the second channel region, the second metal gate having a uniform thickness.

10. The semiconductor device of claim 9, wherein a ratio of the first thickness to the second thickness is from 1.5 to 10.

11. The semiconductor device of claim 9, wherein the first gate portion has a first height and the second gate portion has a second height equal to or greater than the first height.

12. The semiconductor device of claim 11, wherein a ratio of the first height to the second height is from 0.1 to 1.

13. The semiconductor device of claim 9, wherein the first gate portion has a first height and the second gate portion has a second height less than the first height.

14. The semiconductor device of claim 13, wherein a ratio of the first height to the second height is from 1.5 to 10.

15. The semiconductor device of claim 9, wherein the first metal gate comprises Al, Ti, or TiN.

16. The semiconductor device of claim 9, wherein a cross-sectional shape of the second gate portion comprises a square, rectangular, or triangular shape.

17. The semiconductor device of claim 9, wherein the first thickness is substantially equal to the uniform thickness.

18. A semiconductor device comprising:
a drain region;
a source region;
a channel region between the drain region and the source region; and
a metal gate surrounding a portion of the channel region, the metal gate comprising:
  a neck region proximate the drain region, the neck region having a first region with a first width and a second region with a second width greater than the first width, wherein the neck region is a first material; and
  a shoulder portion proximate the source region, the shoulder portion having a third width greater than the first width and the second width, wherein the shoulder portion is the first material.

19. The semiconductor device of claim 18, wherein the neck region and the shoulder portion is an integral piece.

20. The semiconductor device of claim 18, wherein a ratio of the second width to the first width is from 1.5 to 10.

* * * * *